United States Patent [19]
Perner

[11] Patent Number: 5,805,477
[45] Date of Patent: Sep. 8, 1998

[54] ARITHMETIC CELL FOR FIELD PROGRAMMABLE DEVICES

[75] Inventor: Frederick A. Perner, Palo Alto, Calif.

[73] Assignee: Hewlett-Packard Company, Palo Alto, Calif.

[21] Appl. No.: 718,849

[22] Filed: Sep. 26, 1996

[51] Int. Cl.⁶ .................. G06F 7/38; G06F 7/52
[52] U.S. Cl. .................. 364/716.03; 364/716.07; 364/759
[58] Field of Search .......... 364/716.01, 716.02, 364/716.03, 716.04, 716.05, 716.06, 716.07, 754.01, 757, 758, 759; 326/37, 38, 39

[56] References Cited

U.S. PATENT DOCUMENTS

| | | | |
|---|---|---|---|
| 4,758,985 | 7/1988 | Carter | 364/716.03 X |
| 5,287,299 | 2/1994 | Lin | 364/759 |
| 5,396,127 | 3/1995 | Chan et al. | 326/44 |
| 5,430,390 | 7/1995 | Chan et al. | 326/38 |
| 5,570,039 | 10/1996 | Oswald et al. | 364/716.03 X |
| 5,640,106 | 6/1997 | Erickson et al. | 326/38 |

*Primary Examiner*—Chuong Dinh Ngo
*Attorney, Agent, or Firm*—Timothy Rex Croll

[57] ABSTRACT

An arithmetic cell to be used in field programmable devices is defined in this invention. This cell will allow efficient implementations of multipliers, multipliers/accumulators and adders (addition, compare, and subtraction) in one compact cell that is a collection of circuits common to field programmable devices. This cell may be used in a flexible manner that allows full multipliers of any dimension (n*m products), adders of any length (n+m sums, compare, differences), accumulators, and registers (to hold complete results or partial products). Key elements in this invention are an application controlled multiplexer, signal routing to provide a shift function for multiplication, and a minimum collection of configuration bits and circuit elements to perform the basic arithmetic functions.

19 Claims, 5 Drawing Sheets

ARITHMETIC CELL FOR FIELD PROGRAMMABLE DEVICES

BACKGROUND OF THE INVENTION

1. Field of the Invention

The present invention relates to application specific integrated circuit devices and, more particularly, to programmable elements within field programmable devices.

2. Description of the Related Art

Application specific integrated circuits ("ASIC") provide their users the ability to manufacture products having a proprietary design without having to begin design at the device level. Many different ASIC technologies are available, including gate array, standard cell, full custom design and programmable logic devices. The gate array, standard cell and full custom technologies offer high performance and flexibility, although at the expense of a long development cycle and a high non-recurring engineering cost. Programmable logic devices, which include programmable logic array devices ("PLD"), field programmable logic array devices ("FPLA"), and programmable gate array devices ("FPGA"), are useful in a variety of applications such as glue logic and simple integrated circuit designs. Their utility has been limited in general due to the relatively low number of available usable gates, poor flexibility in implementing the required logic functions, low speed of operation and high power consumption.

The reason for the limited utility of field programmable devices is generally due to the exponential increase in size of the array as the number of logic elements increase. The programmable elements in a programmable array are constructed of active devices such as diodes or transistors interconnected by fusible links, ultraviolet erasable or electrically erasable floating gate devices or active devices controlled by local memory circuits. Generally such devices are resistive and high in parasitic capacitance, and consume a relatively large silicon area. Because each programmable element typically consumes a certain amount of power, as the array size increases, the power dissipation increases. Moreover, the speed decreases with increasing array size, due to the increasingly parasitic capacitance of the array. Hence, for a given technology, the size of the array is limited by practical limitations.

The utility of field programmable devices has been further extended by the technique of a programmable interconnect network for devices consisting of small programmable logic functional units. A typical field programmable device has an array of programmable logic functional units. Each functional unit performs one or more logical functions. Vertical and horizontal lines are permanently connected to the inputs and similarly to the outputs of each functional unit. The horizontal and vertical lines cross at various areas of the device to form programmable interconnection matrices. Programming may be by mask, conductive fuses, EPROM/EEPROM switching transistors, or normal logic transistors connected to programming memory elements. Other types of functional units such as random access memories and arithmetic logic units may be present.

Furthermore, existing field programmable devices have attempted to include features in their field programmable cells to enhance the arithmetic operation of addition. These devices contain four-input logic tables, flip-flops, carry logic, and configuration switches, as well as circuitry for implementing adders and logic that may include carry signals to nearest neighbor cells. Thus, basic arithmetic functions may be implemented as general logic in these field programmable devices. Again, however, although arithmetic functions can be found in many applications, these functions tend to fit poorly into current field programmable devices further reducing density and performance.

Moreover, there is currently no mechanism that can be used in a FPLA to efficiently perform multiplication.

Thus, it can be seen that poor circuit density and performance limits of current technology field programmable devices limits the use of these devices in many applications.

Therefore, there is an unresolved need for a field programmable device that will significantly improve the density and performance of applications that use common arithmetic functions.

SUMMARY OF THE INVENTION

The invention is a method and apparatus that provides a field programmable device with an arithmetic cell that significantly improves the density and performance of applications that use common arithmetic functions. Within the cell, application accessible configuration switches and bit shifting circuits are added to create an efficient basic arithmetic cell to be used as a programmable element in a field programmable device. Furthermore, multiplication is enhanced through the addition of two multiplexers and cell routing to allow a data shift.

Thus, an arithmetic cell to be used in field programmable devices is defined in this invention. This arithmetic cell permits efficient implementation of multipliers, multipliers/accumulators, and adders (addition, compare, and subtraction) in one compact cell that is a collection of circuits common to field programmable devices. This arithmetic cell is used in a flexible manner that permits implementation of full multipliers of any dimension (n*m products), adders of any length (n+m sums, compare, differences), accumulators and registers (to hold complete results or partial products). Key elements in this invention are an application controlled multiplexer, signal routing to provide a shift function for multiplication, and a minimum collection of configuration bits and circuit elements to perform the basic arithmetic functions.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

Embodiments of the invention are discussed below with reference to FIGS. 1–5. Those skilled in the art will readily appreciate that the detailed description given herein with respect to these figures is for explanatory purposes, however, because the invention extends beyond these limited embodiments.

Figure 1:
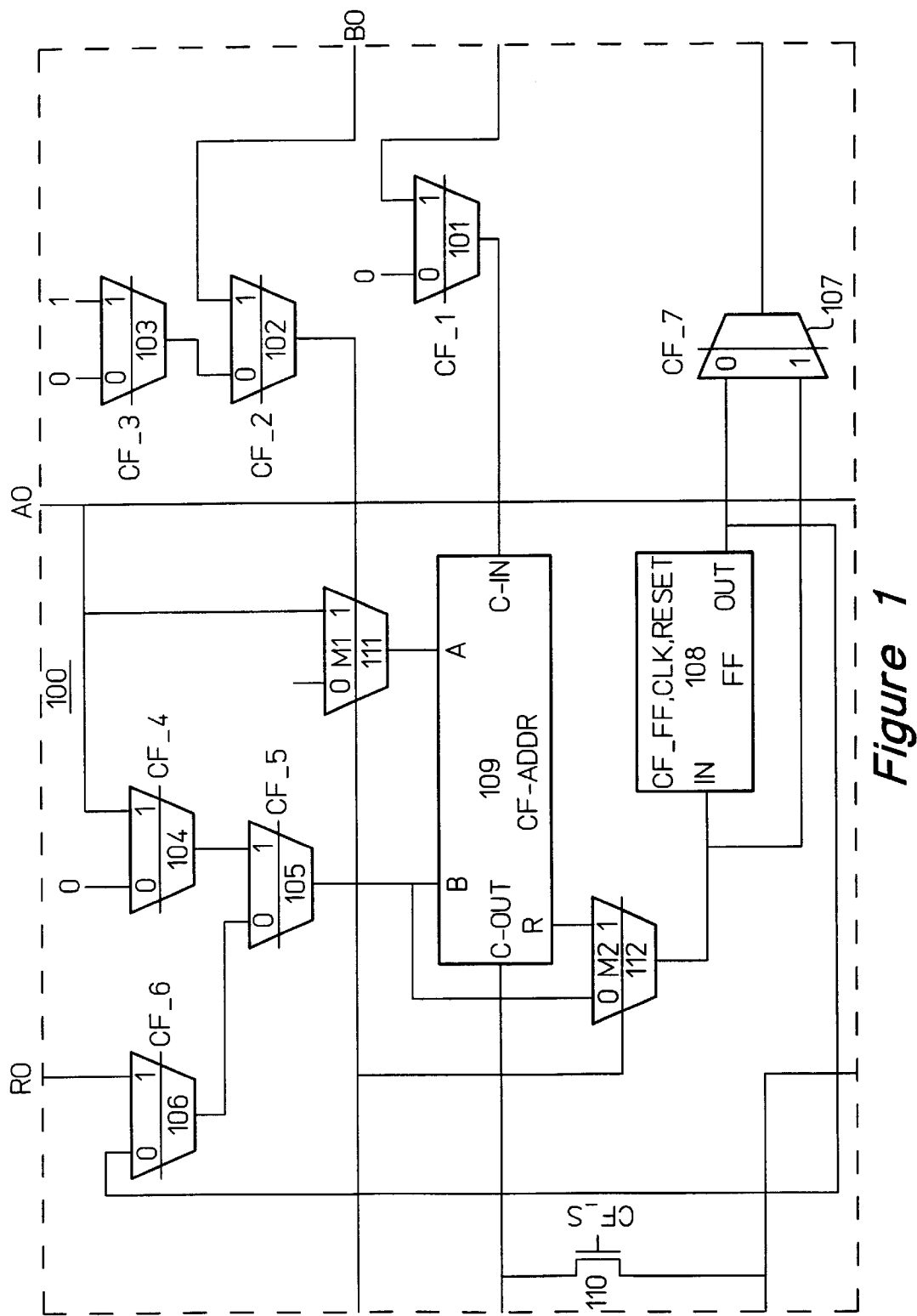
FIG. 1 is a circuit schematic of a configurable arithmetic cell for a field programmable device wherein the cell is illustrative of a cell constructed according to the present invention.

FIG. 1 is a circuit schematic of a configurable arithmetic cell 100 for a field programmable device wherein the cell 100 is an illustrative embodiment of a cell constructed according to the present invention. Arithmetic cell 100 includes steering logic 101–107, flip flop (FF) circuit 108, a 16 bit look-up table (LUT) configured as an adder (ADDR) circuit 109, switch 110 and multiplexer circuits 111–112 (M1–M2). Each of the elements 101–112 of cell 100 are representative of classes of known components and therefore further discussion of these elements will be limited to describing how they operate within the context of the arithmetic cell of the present invention.

For one embodiment of cell 100, ADDR 109 is a full adder circuit having input and output signals. Signals A, B, C_IN and CF_ADDR are input signals wherein signals A, B and C_IN are respective first, second, and third addend signals and signal CF_ADDR is a 16 bit configuration signal for an 8-by-2 look-up table (LUT) that implements the adder circuit. Signals R and C_OUT are output signals wherein signal R is the result signal (i.e., the sum of addend signals A, B and carry input signal C_IN) and wherein signal C_OUT is the carry output signal representing the carry, if any, formed when calculating result signal R.

Similarly, for one embodiment of cell 100, flip flop (FF) 108 is a D-type flip flop circuit having input and output signals. Signals IN, CLK, RESET and CF_FF are input signals wherein signal IN is an input signal representing the datum to be latched in FF 108, signals CLK and RESET are respective clock and reset signals for FF 108 and signal CF_FF is a configuration signal for the flip flop circuit. Signal OUT is an output signal indicating the datum value latched in flip flop 108.

In arithmetic cell 100, steering logic 101–107 have respective configuration signals CF_1–CF_7. Similarly, as will be explained below in greater detail, M1 and M2 (i.e., respective multiplexers 111 and 112) are also controlled by control signals. Configuration signals CF_1–CF_7, CF_ADDR and CF_FF control the configuration of arithmetic cell 100 and permit cell arrays to provide flexible field programmable devices. Thus, cell 100 will permit efficient implementations of multipliers, multipliers/accumulators, and adders (addition, compare, and subtraction) in one compact cell that is a collection of circuits common to field programmable devices. This cell may be used in a flexible manner that allows full multipliers of any dimension (n*m products), adders of any length (n+m sums, compare, differences), accumulators, and registers (to hold complete results or partial products). Key elements in this invention are an application controlled multiplexer, signal routing to provide a shift function for multiplication, and a minimum collection of configuration bits and circuit elements to perform the basic arithmetic functions.

Thus, FIG. 1 is circuit schematic of an exemplary basic arithmetic cell of this invention. The elements ADDR 109, FF 108, and steering logic 101-107 are common field programmable cell components. Multiplexers 111 and 112 (M1 and M2) and switch 110 are introduced as a key parts of this invention to permit this adder cell to function as an efficient multiplier. Furthermore, the configuration of the other components is set to give this cell the flexibility to function as any part of a regular array circuit that will perform multiplication as well as addition or accumulate functions. Herein, "accumulate" is defined as the circuit function of adding a number to the contents of a register.

Multiplication is performed by testing the active bit of the multiplier and performing the multiplication operation differently based upon the value of the active bit. If the active bit of the multiplier is a "1", the multiplicand is added to a partial product and the resultant partial product is then shifted to the next row and one column over in the the multiplier array. However, if the active bit of the multiplier is a "0", the resultant partial product is simply shifted down one row and over one column. In cell 100, multiplexers 111 and 112 (M1 and M2) perform the test on the active bit of the multiplier. Routing within the arithmetic cell then performs the partial product shift.

Figure 2:
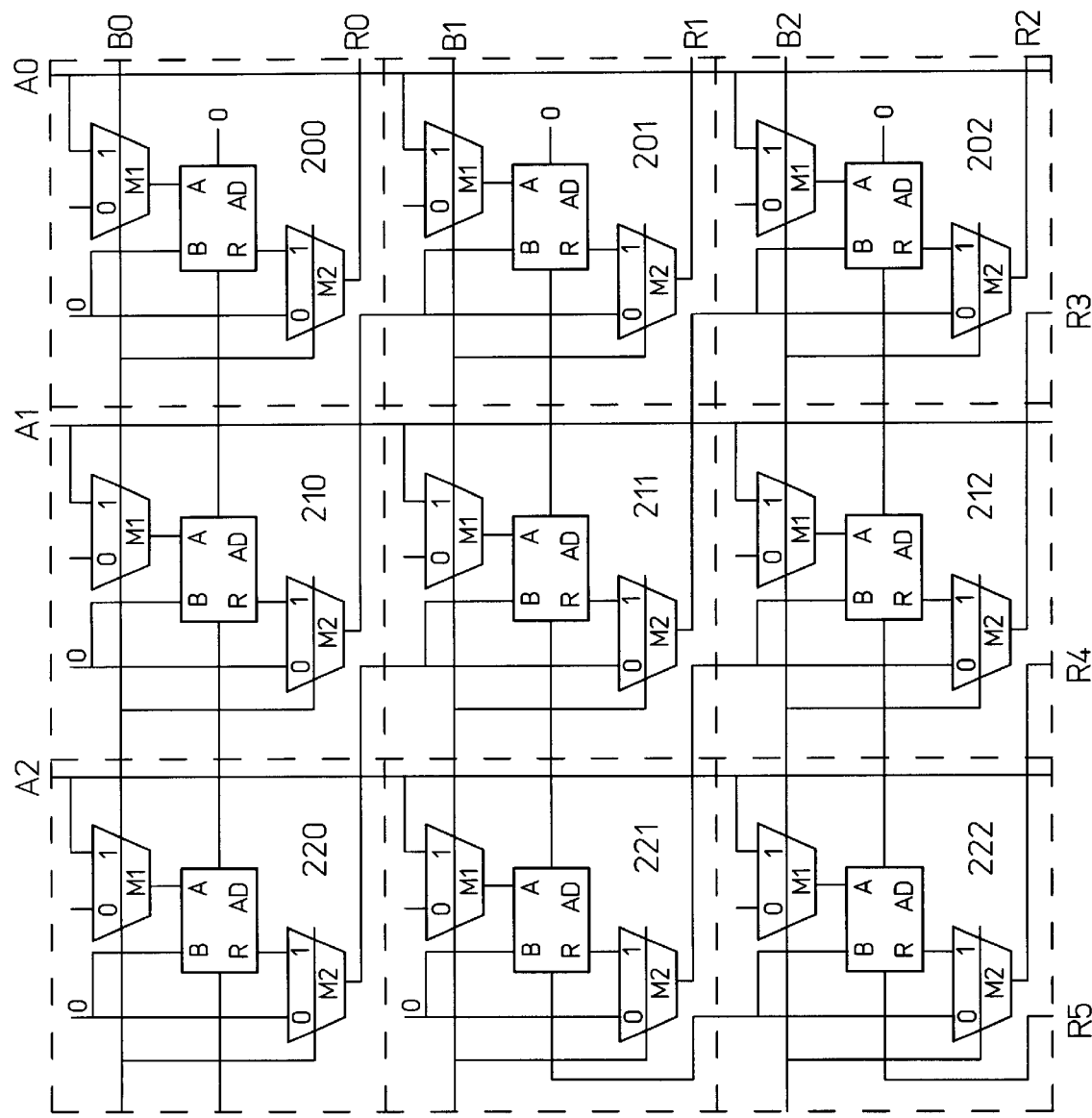
FIG. 2 is a circuit schematic of a 3-by-3 matrix of arithmetic cells of the type represented in FIG. 1 wherein the cells are configured to provide a multiplier circuit.

One example of the application of the arithmetic cell 100 is a 3-by-3 multiplier. FIG. 2 is a circuit schematic of a 3-by-3 multiplier comprised of a 3-by-3 matrix of arithmetic cells 100 shown in FIG. 1. A 3-bit multiplier signal (B2:B0) enters the "right" edge of the array (cells 200:202), a 3-bit multiplicand signal (A2:A0) enters the "top" of the array (cells 220, 210 and 200), and a product signal (R5:R0) exits the "right" edge and the "bottom" of the array (cells 200:202, 212, and 222). The "top" row of cells (cells 220, 210 and 200) introduce a "0" initial partial product to the array with configuration bits (CF_4, CF_5, and CF_6 of FIG. 1). Cell 221 shifts the carry out from its adder "AD" to the most-significant-bit of the partial product of the next row of cells by setting the configuration bit CF_S to bias the transistor 110 to a low impedance state. Cell 222 shifts the carry out from its adder "AD" to the most-significant-bit of the product (bit R5) by setting the configuration bit CF_S to bias the transistor 110 to a low impedance state. The multiplier may operate in an asynchronous mode or be broken into pipeline stages by using the registers in each cell (FF 108 of FIG. 1) to store the partial products. The multiplier depicted in FIG. 2 is shown as an asynchronous multiplier.

Thus, a direct result of the configuration of the arithmetic cell 100 (FIG. 1) is a rectangular "n*m" multiplier configuration where the "n" bits of the multiplicand are vertically aligned with the "n" most-significant-bits of the product and the "m" multiplier bits form rows of the multiplier array and are aligned with the "m" least-significant-bits of the product. This circuit structure is highly compatible with field programmable devices for defining efficient and flexible multiplier and adder arrays.

Figure 3:
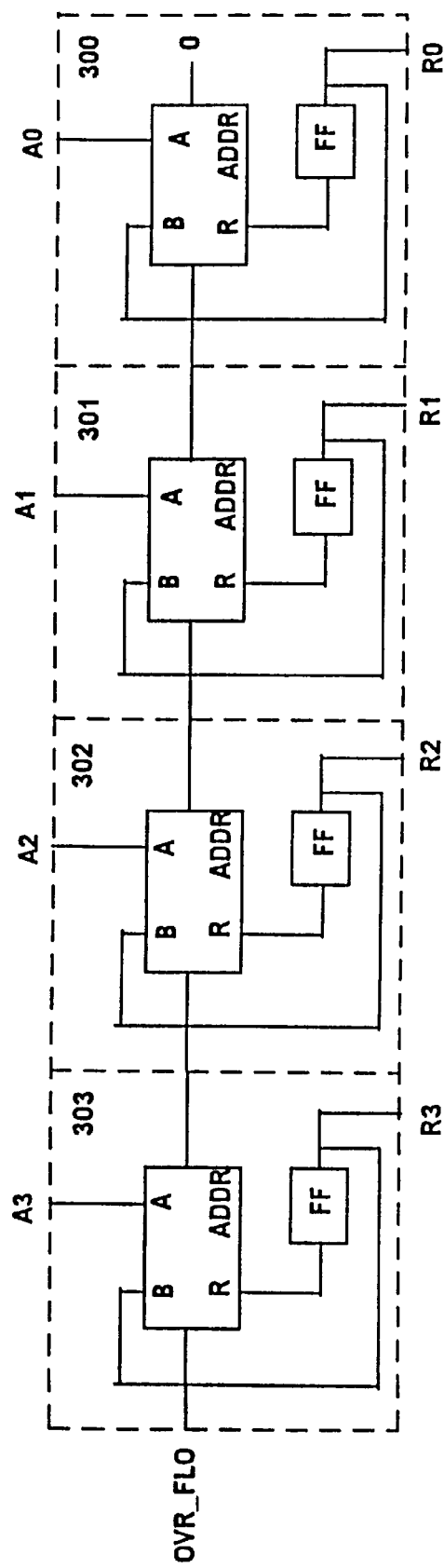
FIG. 3 is a circuit schematic of a 4-by-1 matrix of arithmetic cells of the type represented in FIG. 1 wherein the cells are configured to provide an accumulator circuit.

A second example of the application of the arithmetic cell is a 4 bit accumulator (FIG. 3). The accumulator function is added to the basic adder circuit by using configuration bits CF_4, CF_5 and CF_6 to set respective multiplexer steering logic 104, 105, and 106 so as to route the output of the flip-flop (FF) 108 back to input B of the 1 bit adder (ADDR) 104.

Figure 4:
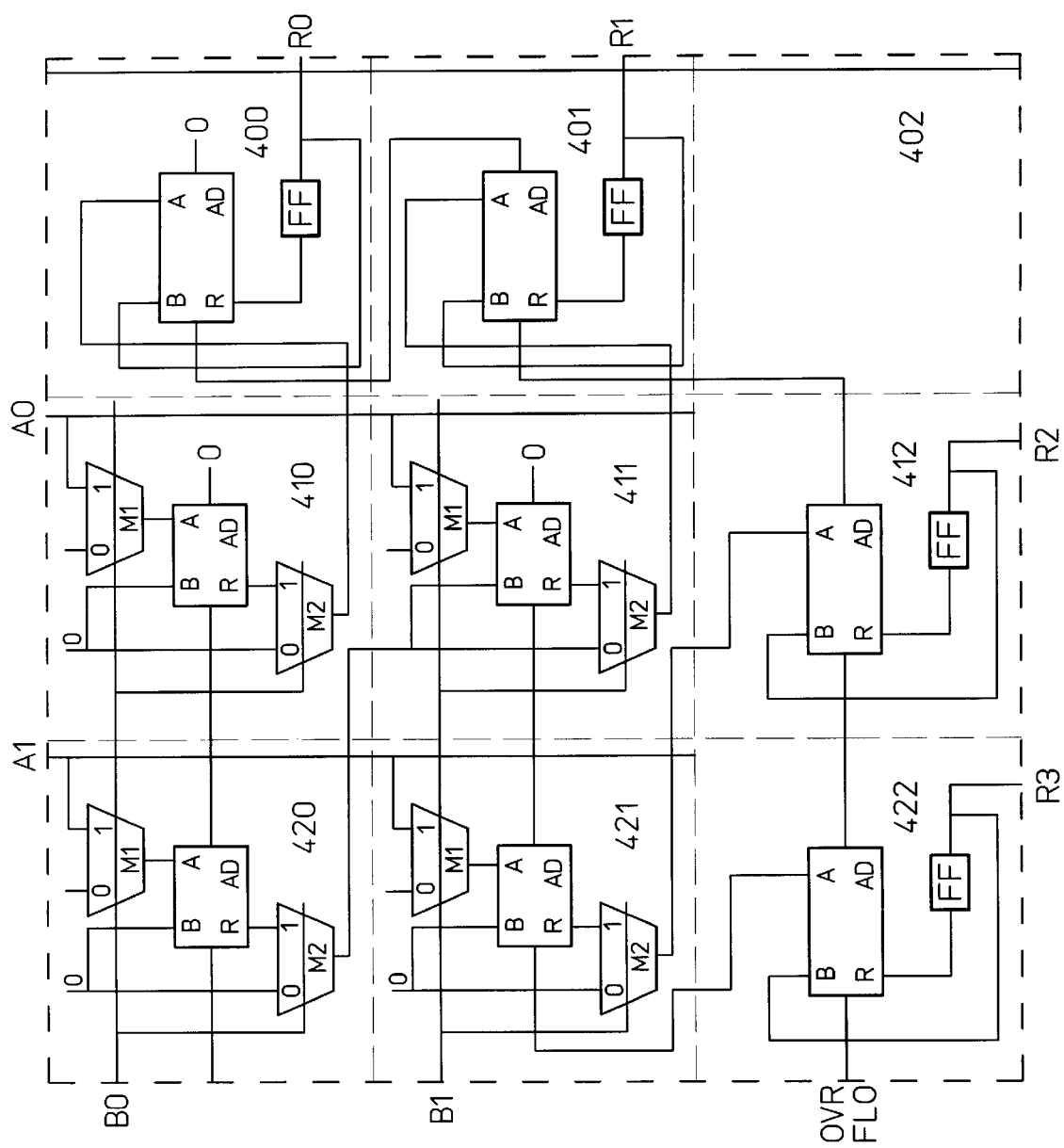
FIG. 4 is a circuit schematic of a 3-by-3 matrix of arithmetic cells of the type represented in FIG. 1 wherein the cells are configured to provide a 2 bit multiplier accumulator circuit.

The third example of the application of the arithmetic cell 100 is a 2 bit MAC (FIG. 4, 2 bit Multiplier Accumulator). In FIG. 4, cells 410, 420, 411 and 421 are configured to form a 2 bit multiplier in a manner similar to that illustrated in the 3 bit case of FIG. 2. Cells 412 and 422 are configured to form a 2 bit accumulator in a manner similar to that illustrated in the 4 bit case of FIG. 3. In a similar manner to the "horizontal" accumulator cells of the two high order result bits, cells 400 and 401 are configured to form a 2 bit "vertical" accumulator for the two low order result bits (R0:R1).

Figure 5:
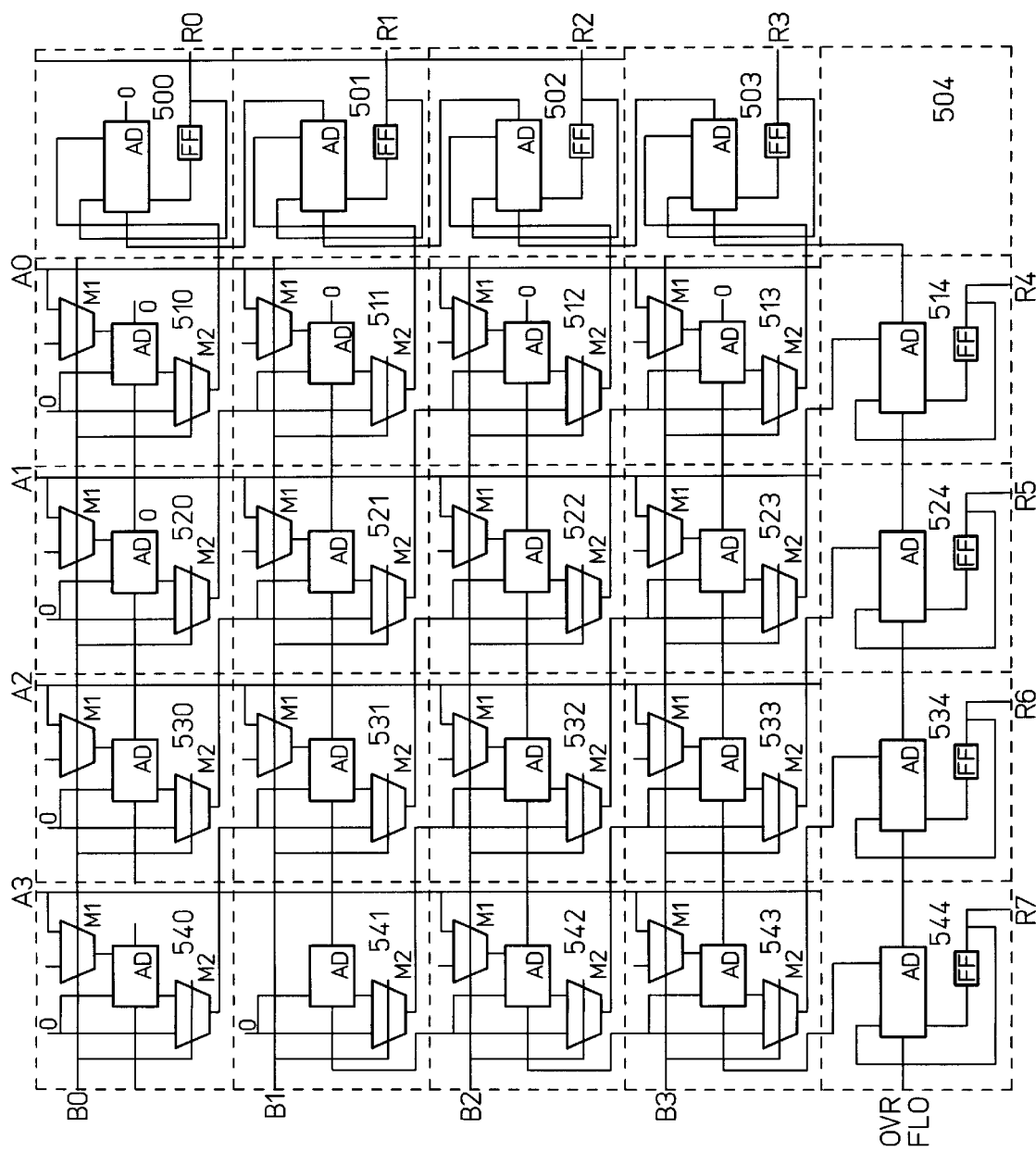
FIG. 5 is a circuit schematic of a 5-by-5 matrix of arithmetic cells of the type represented in FIG. 1 wherein the cells are configured to provide a 4 bit multiplier accumulator circuit.

FIG. 5 is a circuit schematic of a 5-by-5 matrix of arithmetic cells of the type represented in FIG. 1 wherein the cells are configured to provide a 4 bit multiplier circuit. Thus, FIG. 5 illustrates how the 2 bit MAC of Figure can be expanded to form a 4 bit MAC. In FIG. 5, cells 510, 520, 530, 540, 511, 521, 531, 541, 512, 522, 532, 542, 513, 523, 533 and 543 are configured to form a 4 bit multiplier in a manner similar to that illustrated in the 3 bit case of FIG. 2. Cells 514, 524, 534 and 544 are configured to form a 4 bit accumulator in a manner similar to that illustrated in FIG. 3. In a similar manner to the "horizontal" accumulator cells of the four high order result bits, cells 500, 501, 502 and 503 are configured to form a 4 bit "vertical" accumulator for the four low order result bits (R0:R3).

Thus it can be seen that an advantage of this invention is to provide an array building block for field programmable devices that permits an efficient implementation of multipliers and other basic arithmetic functions. The two multiplexers shown in FIG. 1 as M1 and M2 are efficiently included in the arithmetic cell thus eliminating the need to consume a general logic cell in existing field programmable devices. The collection of programmable devices in the arithmetic cell is minimized to efficiently perform the functions:

addition A+B=R
compare A=?B
subtraction A−B=R or B−A=R
accumulate A+R(n−1)=R(n)
multiply A*B=R
multiply-accumulate A(n)*B(n)+R(n−1)=R(n)

Physical layout of the arithmetic cell is estimated to consume about one quarter of a general logic cell. The cell compaction and increased function increases the effective cell density by a factor of 10. Performance is improved by reducing intercell wire capacitance found in general logic cells and by reducing the number of series configuration switches that must be used to implement arithmetic functions from general logic cells.

Another advantage of the arithmetic cell is the general nature of the cell that allows for building mixtures of n*m multipliers, adders, registers, and accumulators within an homogeneous array of the arithmetic cells. The collection of wires, components, and configuration bits are sufficient to build complete arithmetic circuits without requiring the use of general logic cells.

The many features and advantages of the invention are apparent from the written description and thus it is intended by the appended claims to cover all such features and advantages of the invention. Further, because numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. An arithmetic cell for a programmable device, the cell comprising:
   an adder;
   a first multiplexer;
   a second multiplexer; and
   a steering logic configurable to perform a multiplication operation,
   wherein the first and second multiplexers cooperate to perform a test on an active bit of a multiplier input to the adder, and if the active bit of the multiplier is a "1", a multiplicand input to the adder is added to a partial product and the resultant partial product is then shifted, however, if the active bit of the multiplier is a "0", the resultant partial product is shifted without adding.

2. The arithmetic cell as set forth in claim 1, wherein the adder is a look-up table configured as an adder.

3. The arithmetic cell as set forth in claim 1, further comprising a flip-flop configurable to latch the result from the adder and thereby perform a multiply-accumulate operation.

4. The arithmetic cell as set forth in claim 3, wherein the steering logic can be configured to perform accumulation in the flip-flop without multiplication.

5. The arithmetic cell as set forth in claim 3, wherein the steering logic and the adder can be configured to perform latching in the flip-flop without multiplication and without accumulation.

6. The arithmetic cell as set forth in claim 1, wherein the steering logic and the adder can be configured to perform addition.

7. The arithmetic cell as set forth in claim 1, wherein the steering logic and the adder can be configured to perform comparison.

8. The arithmetic cell as set forth in claim 1, wherein the steering logic can be configured to perform subtraction.

9. A method of performing multiplication within an arithmetic cell for a programmable device, the arithmetic cell including an adder, first and second multiplexers and a configurable steering logic, the method comprising the steps of:
   configuring the steering logic to perform the multiplication operation; and
   using the first and second multiplexers to cooperatively perform a test on an active bit of a multiplier input to the adder;
   if the active bit of the multiplier is a "1", a multiplicand input to the adder is added to a partial product and the resultant partial product is then shifted;
   however, if the active bit of the multiplier is a "0", the resultant partial product is shifted without adding.

10. The method of performing multiplication within an arithmetic cell for a programmable device as set forth in claim 9, wherein the adder is a look-up table configured as an adder.

11. The method of performing multiplication within an arithmetic cell for a programmable device as set forth in claim 9, wherein the arithmetic cell further includes a flip-flop, and the method further comprises the steps of:
   configuring the steering logic to perform an accumulation operation with the multiplication operation; and
   using the flip-flop to latch the result from the adder and thereby perform the accumulate operation.

12. A programmable device, the programmable device comprising an array of cells wherein at least one of the cells is an arithmetic cell having:
   an adder;
   a first multiplexer;
   a second multiplexer; and
   a steering logic configurable to perform a multiplication operation,
   wherein the first and second multiplexers cooperate to perform a test on an active bit of a multiplier input to the adder, and if the active bit of the multiplier is a "1", a multiplicand input to the adder is added to a partial product and the resultant partial product is then shifted, however, if the active bit of the multiplier is a "0", the resultant partial product is shifted without adding.

13. The programmable device as set forth in claim 12, wherein the adder is a look-up table configured a an adder.

14. The programmable device as set forth in claim 12, wherein the arithmetic cell further comprises a flip-flop configurable to latch the result from the adder and thereby perform a multiply-acumulate operation.

15. The programmable device as set forth in claim 14, wherein the steering logic can be configured to perform accumulation in the flip-flop without multiplication.

16. The programmable device as set forth in claim 14, wherein the steering logic can be configured to perform latching in the flip-flop without multiplication and without accumulation.

17. The programmable device as set forth in claim 12, wherein the steering logic and the adder can be configured to perform addition.

18. The programmable device as set forth in claim 12, wherein the steering logic and the adder can be configured to perform comparison.

19. The programmable device as set forth in claim 12, wherein the steering logic and the adder can be configured to perform subtraction.

* * * * *